United States Patent
Sun et al.

(10) Patent No.: US 10,419,018 B2
(45) Date of Patent: Sep. 17, 2019

(54) REAL-TIME ANNULUS PRESSURE WHILE DRILLING FOR FORMATION INTEGRITY TEST

(71) Applicant: Schlumberger Technology Corporation, Sugar Land, TX (US)

(72) Inventors: Yong Sun, Sugar Land, TX (US); Bo Yu, Sugar Land, TX (US); Sandra Reyes Ribera, Katy, TX (US); Aldrick Garcia-Mayans, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 443 days.

(21) Appl. No.: 15/146,590

(22) Filed: May 4, 2016

(65) Prior Publication Data
US 2017/0170842 A1    Jun. 15, 2017

Related U.S. Application Data

(60) Provisional application No. 62/158,614, filed on May 8, 2015.

(51) Int. Cl.
| | | |
|---|---|---|
| *E21B 47/13* | (2012.01) | |
| *H03M 7/30* | (2006.01) | |
| (Continued) | | |

(52) U.S. Cl.
CPC .............. *H03M 7/30* (2013.01); *E21B 21/08* (2013.01); *E21B 47/06* (2013.01); *E21B 47/12* (2013.01);
(Continued)

(58) Field of Classification Search
CPC .......... H03M 7/30; E21B 49/00; E21B 47/18; E21B 21/08; E21B 47/06
See application file for complete search history.

(56) References Cited

U.S. PATENT DOCUMENTS

| 4,302,757 A | 11/1981 | Still |
|---|---|---|
| 5,252,031 A | 10/1993 | Gibbs |
| (Continued) | | |

FOREIGN PATENT DOCUMENTS

| EP | 2505971 A2 | 10/2012 |
|---|---|---|
| WO | 2003098266 A1 | 11/2003 |
| (Continued) | | |

OTHER PUBLICATIONS

International Search Report and Written Opinion issued in related PCT application PCT/US2016/031147 dated Aug. 17, 2016, 12 pages.

(Continued)

*Primary Examiner* — Pho M Luu

(57) ABSTRACT

Aspects of the disclosure can relate to a process for transmitting a pump-off pressure profile for formation integrity testing within a limited bandwidth. For example, a process may include measuring pump-off pressure data. The pump-off pressure data represents the pump-off pressure profile. The method also includes determining, from the pump-off pressure data, a pump-off pressure data portion corresponding to a formation integrity testing characteristic. The method also includes compressing pump-off pressure data portion with a compression protocol to produce compression bits. The compression bits representing the pump-off pressure data portion corresponding to the formation integrity testing characteristic. The method also includes transmitting, via a communication module, the compression bits to a computing device.

10 Claims, 22 Drawing Sheets

(51) Int. Cl.
*E21B 47/06* (2012.01)
*E21B 47/12* (2012.01)
*E21B 47/18* (2012.01)
*E21B 49/00* (2006.01)
*E21B 21/08* (2006.01)

(52) U.S. Cl.
CPC .............. *E21B 47/18* (2013.01); *E21B 49/00* (2013.01); *E21B 49/008* (2013.01)

(56) References Cited

U.S. PATENT DOCUMENTS

| | | |
|---|---|---|
| 2002/0011333 A1 | 1/2002 | Ward |
| 2003/0214879 A1 | 11/2003 | Proett et al. |
| 2004/0045706 A1 | 3/2004 | Pop et al. |
| 2004/0145503 A1 | 7/2004 | Blanch et al. |
| 2006/0015257 A1 | 1/2006 | Hassan et al. |
| 2006/0055556 A1 | 3/2006 | Memarzadeh et al. |
| 2006/0195612 A1 | 8/2006 | Alvarez Arevalo et al. |
| 2006/0235618 A1 | 10/2006 | Wu et al. |
| 2006/0294448 A1 | 12/2006 | Wybenga et al. |
| 2007/0057811 A1 | 3/2007 | Mehta |
| 2007/0162235 A1 | 7/2007 | Zhan et al. |
| 2007/0194947 A1 | 8/2007 | Huang et al. |
| 2007/0198192 A1 | 8/2007 | Hsu et al. |
| 2008/0131087 A1 | 6/2008 | Lee et al. |
| 2009/0034367 A1 | 2/2009 | Sherrill |
| 2009/0101340 A1 | 4/2009 | Jeffryes |
| 2009/0165548 A1 | 7/2009 | Pop et al. |
| 2009/0190850 A1* | 7/2009 | Tang ................... G01V 11/00 382/251 |
| 2009/0294174 A1* | 12/2009 | Harmer ................ E21B 47/06 175/45 |
| 2011/0051805 A1 | 3/2011 | Van Splunter et al. |
| 2011/0139464 A1* | 6/2011 | Henderson .............. E21B 21/01 166/370 |
| 2011/0206114 A1 | 8/2011 | Kim et al. |
| 2011/0272144 A1 | 11/2011 | Belcher et al. |
| 2014/0214325 A1 | 7/2014 | Wessling et al. |
| 2014/0286538 A1 | 9/2014 | Yu et al. |
| 2015/0330168 A1* | 11/2015 | Sun ........................ E21B 47/06 700/282 |
| 2016/0097275 A1 | 4/2016 | Santoso |
| 2016/0227298 A1 | 8/2016 | White et al. |

FOREIGN PATENT DOCUMENTS

| | | |
|---|---|---|
| WO | 2005096016 A1 | 10/2005 |
| WO | WO2005096013 A1 | 10/2005 |
| WO | WO2013052423 A2 | 4/2013 |

OTHER PUBLICATIONS

International Search Report and the Written Opinion for International Application No. PCT/US2015/030493 dated Aug. 10, 2015.
Examination Report issued in European Patent application 15792034.9 dated Dec. 3, 2018, 5 pages.
Consultative Committee for Space Data Systems (CCSDS): "Packet Telemetry" Blue Book, Issue 5, Boulder, Colorado, Nov. 1, 2000, pp. 1-46.
International Preliminary Report on Patentability issued in International Patent application PCT/US2015/030493, dated Nov. 24, 2016. 6 pages.
International Preliminary Report on Patentability issued in International Patent application PCT/US2016/031147, dated Nov. 23, 2017. 6 pages.
Search Report issued in European Patent application 15792034.9 dated Jan. 19, 2018. 8 pages.
Non-Final Office Action issued in U.S. Appl. No. 14/710,457 dated Apr. 17, 2017. 13 pages.
Final Office Action issued in U.S. Appl. No. 14/710,457 dated Nov. 6, 2017. 17 pages.
Non-Final Office Action issued in U.S. Appl. No. 14/710,457 dated Feb. 27, 2018. 6 pages.

* cited by examiner (A)

(D)

(B)

(E)

(C)

(F)

Note: "· · ·" means binary splitting continues when more values are coded (G)  (H)  (I)

Note: "· · ·" means binary splitting continues when more values are coded

1. If all pressure points are before $P_{max}$:

| Comression bits | xxxx...xxx | 10 | xxxx...xxx |
|---|---|---|---|
| Description | 15 bits for reference pressure | 2 bits to indicate this part is before $P_{max}$ | Bits to code $D_{max}$ |

Continue from above...

| Comression bits | xxxx...xxx | xxxx...xxx | xxxx...xxx |
|---|---|---|---|
| Description | Bits to code $D_{min}$ | Bits to code $D_0$ | Bits to index the optimal one among all codebooks |

Continue from above...

| Comression bits | xxxx...xxx | 0000...000 |
|---|---|---|
| Description | Differential coding bits | Pending 0's if necessary to fill up the available bandwidth |

FIG. 11A

2. If $P_{max}$ is included:

| Comression bits | xxxx...xxx | 0 | xxxx...xxx |
|---|---|---|---|
| Description | 15 bits for reference pressure | 1 bit to indicate $P_{max}$ is included | 8 bits to indicate the position of $P_{max}$ (value 0 indicates $P_{max}$ is the 1st after the reference point |

Continue from above...

| Comression bits | xxxx...xxx | xxxx...xxx | xxxx...xxx |
|---|---|---|---|
| Description | Bits to code $D_{max}$ | Bits to code $D_{min}$ | Bits to code $D_0$ |

Continue from above...

| Comression bits | xxxx...xxx | xxxx...xxx |
|---|---|---|
| Description | Bits to index the optimal one among all codebooks for difference values before and at $P_{max}$ | Coding bits for difference values before and at $P_{max}$ |

FIG. 11B

2. If $P_{max}$ is included:

| Comression bits | xxxx...xxx | xxxx...xxx |
|---|---|---|
| Description | Bits to index the optimal one among all codebooks for difference values after $P_{max}$ | Coding bits for difference values after $P_{max}$ |

Continue from above...

| Comression bits | 0000...000 |
|---|---|
| Description | Pending 0's if necessary to fill up the available bandwidth |

FIG. 11C

3. If all pressure points are after $P_{max}$:

| Comression bits | xxxx...xxx | 11 | xxxx...xxx |
|---|---|---|---|
| Description | 15 bits for reference pressure | 2 bits to indicate this part is before $P_{max}$ | Bits to code $D_{max}$ |

Continue from above...

| Comression bits | xxxx...xxx | xxxx...xxx | xxxx...xxx |
|---|---|---|---|
| Description | Bits to code $D_{min}$ | Bits to code $D_0$ | Bits to index the optimal one among all codebooks |

Continue from above...

| Comression bits | xxxx...xxx | 0000...000 |
|---|---|---|
| Description | Differential coding bits | Pending 0's if necessary to fill up the available bandwidth |

FIG. 11D

REAL-TIME ANNULUS PRESSURE WHILE DRILLING FOR FORMATION INTEGRITY TEST

CROSS-REFERENCE TO RELATED APPLICATIONS

The present application claims priority to U.S. Provisional Application 62/158,614 filed May 8, 2015, the entirety of which is incorporated by reference.

FIELD OF THE INVENTION

Aspects of the disclosure relate to oil and gas drilling and the recovery of hydrocarbons. More specifically, aspects relate to real-time annulus pressure which drilling for formation integrity tests.

BACKGROUND

Oil wells are created by drilling a hole into the earth using a drilling rig that rotates a drill string (e.g., drill pipe) having a drill bit attached thereto. The drill bit, aided by the weight of pipes (e.g., drill collars), cuts into rock within the earth to create a wellbore. Drilling fluid (e.g., mud) is pumped into the drill pipe and exits at the drill bit. The drilling fluid may be used to cool the bit, lift rock cuttings to the surface, at least partially prevent destabilization of the rock in the wellbore, and/or at least partially overcome the pressure of fluids inside the rock so that the fluids do not enter the wellbore. During the creation of the wellbore, these drilling rigs can measure the physical properties of the well environment. Data representing the measurements can be transmitted to the surface as pressure pulses in a mud system (e.g., mud pulse telemetry) of the oil well.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Aspects of the disclosure can relate to a process for transmitting a pump-off pressure profile for formation integrity testing within a limited bandwidth. For example, a process may include measuring pump-off pressure data. The pump-off pressure data represents the pump-off pressure profile. The method also includes determining, from the pump-off pressure data, a pump-off pressure data portion corresponding to a formation integrity testing characteristic. The method also includes compressing pump-off pressure data portion with a compression protocol to produce compression bits. The compression bits representing the pump-off pressure data portion corresponding to the formation integrity testing characteristic. The method also includes transmitting, via a communication module, the compression bits to a computing device.

BRIEF DESCRIPTION OF THE DRAWINGS

So that the recited features may be understood in detail, a more particular description, briefly summarized above, may be had by reference to one or more embodiments, some of which are illustrated in the appended drawings. It is to be noted, however, that the appended drawings illustrate example embodiments, and are, therefore, not to be considered limiting of its scope.

FIGS. 11A-11D illustrate three (3) example bit layout protocols in accordance with an example embodiment of the present disclosure.

DETAILED DESCRIPTION

Embodiments described herein generally relate to methods for measuring pressure within a wellbore. More particularly, embodiments described herein relate to a system and a method for transmitting a pump-off pressure profile in a wellbore.

Formation integrity tests (FITs) can be performed during pumps-off to determine the maximum annular pressure that can be applied to the formation. Many measurements regarding formation properties (e.g., leak-off pressure, formation fracture pressure, minimum horizontal stress ($\sigma_h$), formation permeability, etc.) can be evaluated from a pumps-off annular pressure profile. The synthetic "downhole" pressure curve, however, may not represent the data properly in most cases and, sometimes, can lead to highly-deviated results. Many factors, such as mud compressibility, gel strength, mud type, and borehole temperature, can contribute to the large discrepancy. Thus, the present disclosure discloses transmitting an annular pressure profile in real-time (RT) for an accurate FIT analysis.

A large amount of annular pressure data may be accumulated during FITs. For example, a 1-hour FIT generates 1,800 pressure points at a sampling period of 2 seconds. Each pressure point utilizes 15 bits to cover the range of 0 psi to 30,000 psi with 1-psi resolution. The total transmission would take 37.5 minutes at a rate of 12 bits/second. Such delays can impact the normal drilling operations since the data from other measurements cannot be sent in a long time period after pumping resumes.

Figure 1:
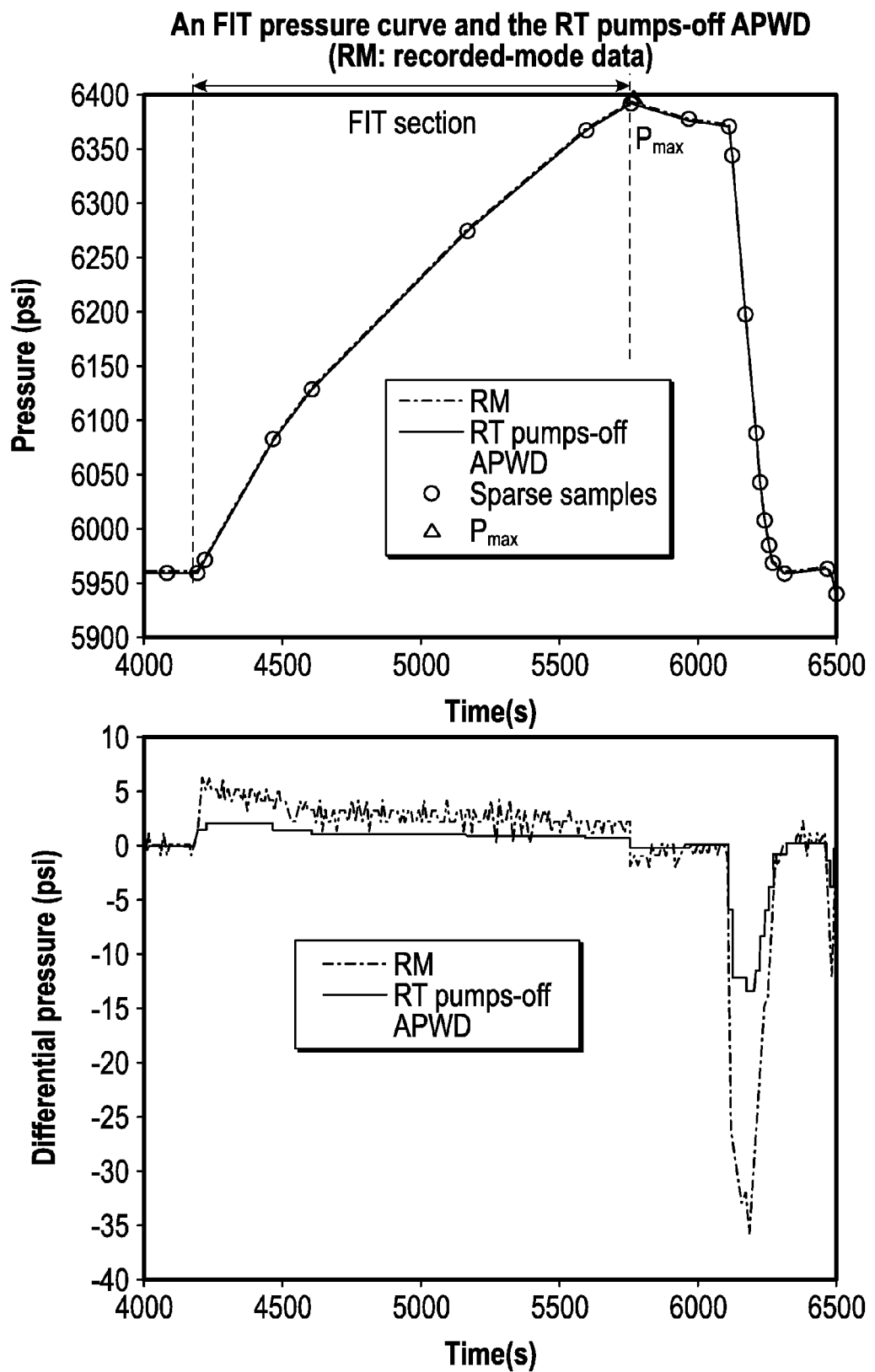
FIG. 1 illustrates an example formation integrity test pressure curve and a real-time pumps-off annulus pressure while drilling pressure curve.

Thus, pressure data representing major turning points along the pressure curve can be transmitted uphole to provide suitable compression ratios and reduce real-time transmission time. The pressure data representing the major turning points allow tracing of the pressure changes and identifying some key measurements, such as leak-off pressure, formation fracture pressure, and so on. In some embodiments, however, where high-density pressure points are utilized for a detailed FIT analysis, the sparse samples may not provide enough information. An example is shown in FIG. 1. From the pressure curve from real-time pumps-off annulus pressure while drilling, the major changes along the FIT can be represented. But for the differential pressure (see the bottom of FIG. 1), the real-time pumps-off annulus pressure while drilling pressure curve shows steps in long time intervals and the subtle changes may be missing.

The present disclosure discloses transmitting a portion of the FIT pressure curve profile. Thus, the present disclosure can be independent of real-time pumps-off annulus pressure while drilling due to different field usages. For example, the present disclosure transmits the FIT section from the start of FIT to the maximum pressure point ($P_{max}$), as indicated in FIG. 1. Extensions on both sides are allowed and an operator can configure their time lengths according to the job requirements. The present disclosure detects the FIT section automatically and then performs compression. The compression bits are encapsulated into a sequence of multiple on-demand frames (MODFs) for real-time transmission. Respective MODFs can be decompressed independently into a part of pressure curve as this can be useful to reduce telemetry noise because part of FIT APWD data is available from the correctly-received MODFs. If a significant portion of the data is missing or corrupted, an operator can downlink to a logging while drilling (LWD) tool and request retransmission of the real-time FIT annulus pressure while drilling pressure curve.

Figure 2A:
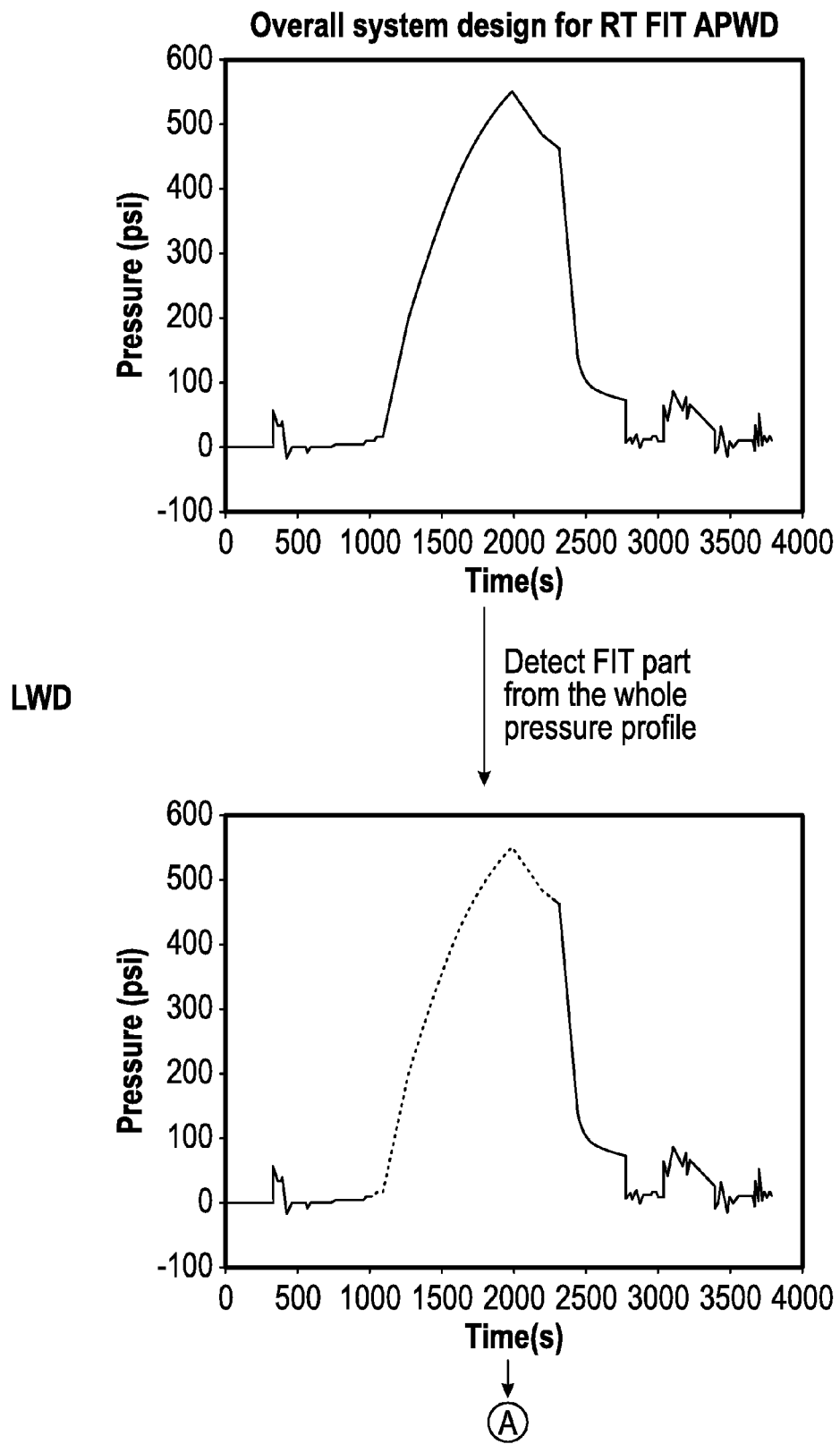
FIGS. 2A-2C illustrate an example diagram for measuring pump-off pressured data, compressing the pump-off pressure data, and transmitting the compressed pump-off pressure data uphole in accordance with an example embodiment of the present disclosure.
Figure 2B:
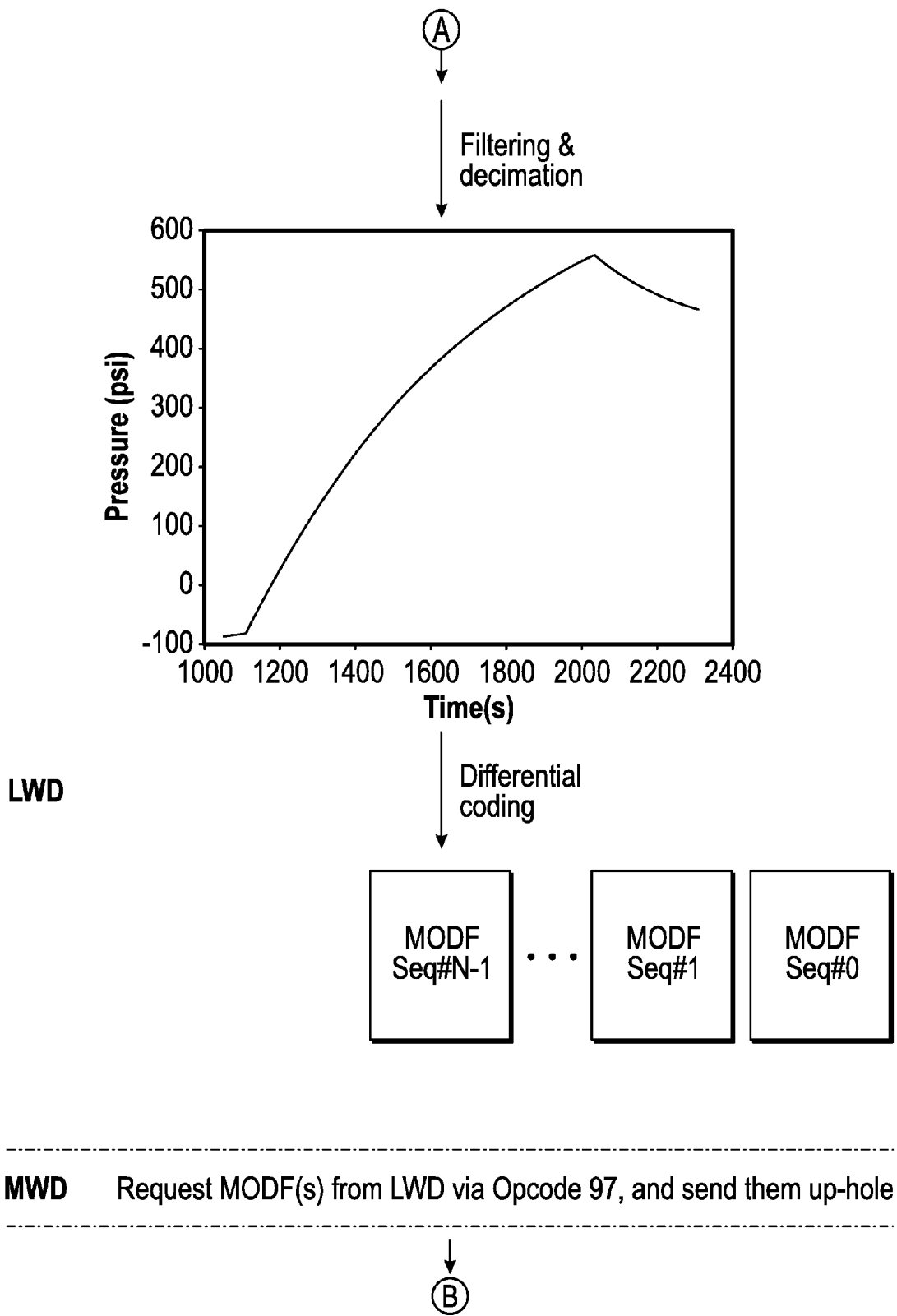
Figure 2C:
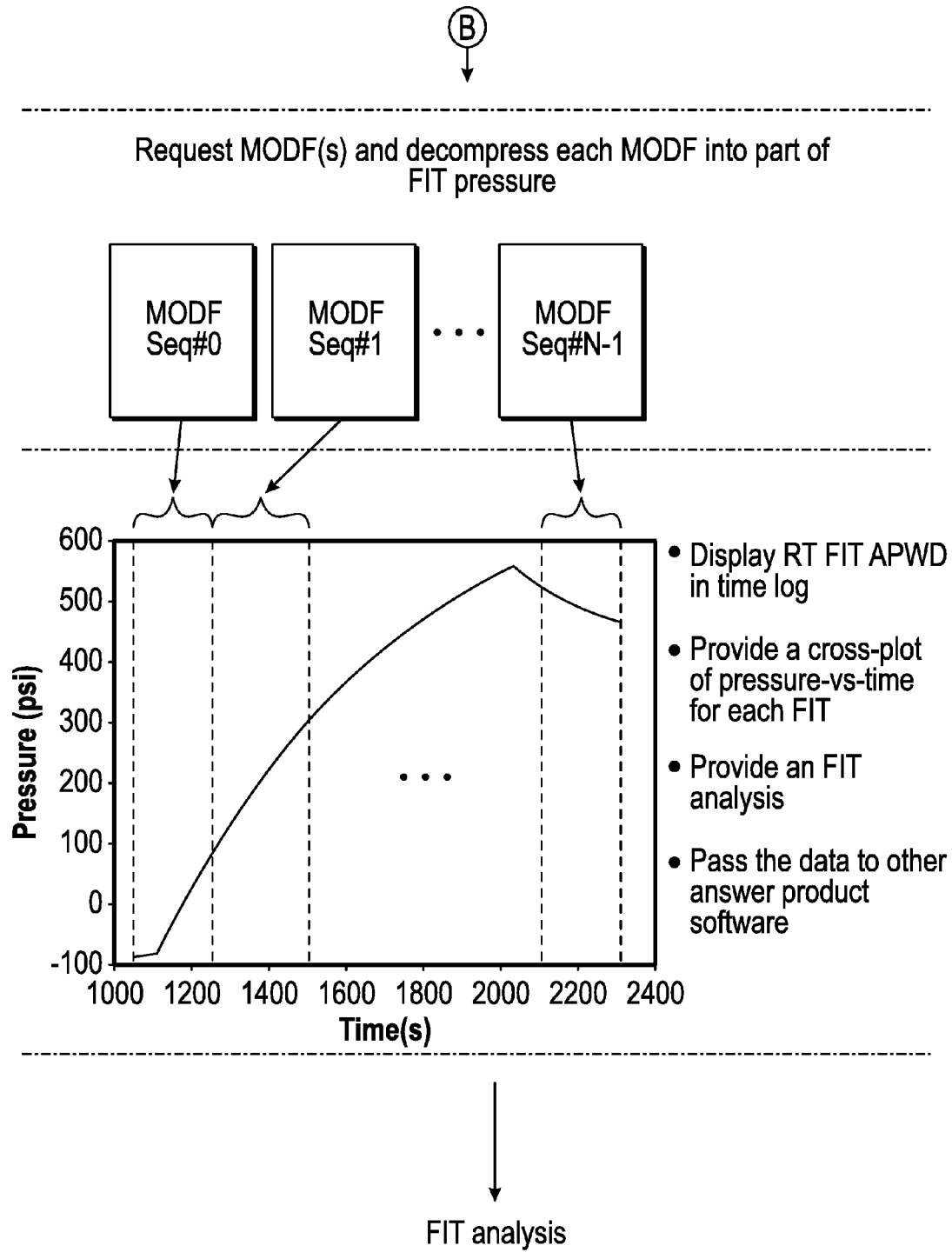

During FIT, the annular pressure data is acquired by the pressure board in the LWD tool. When the pumps-up is detected (e.g., LTB power on), the present disclosure searches the pumps-off pressure profile and identifies (e.g., determines) the FIT section from the start of FIT test to $P_{max}$ (as shown the curve in FIGS. 2A-C). According to the job requirements, the operator is allowed to configure extensions on both sides to allow additional pressure data to be included to help the FIT analysis.

To achieve a high compression efficiency, the pressure data is filtered to remove the measurement noise and then decimated to a preselected sampling period. For example, the preselected sampling period may be a 4-second sampling period. The sampling period, however, can be modified according to the requirements of the data density. Thus, other sampling periods may be utilized. Additionally, differential coding can be applied for data compression because due to the continuity along the FIT annulus pressure while drilling curve.

The compression bits are then encapsulated into a sequence of MODFs for real-time (or near real-time) transmission. Independent MODFs can represent a portion of the FIT annulus pressure while drilling (APWD) curve independently. Thus, if one or more MODFs are lost or corrupted, other parts of FIT curve can still be reconstructed correctly from the available MODF(s).

When the MODFs are ready, the LWD transmits the MODFs to a measuring while drilling (MWD) via a suitable transmission protocol (e.g., Opcode 97), and the MWD arranges the MODFs to send the MODFs up-hole through mud-pulse telemetry.

At the surface, a computing device decodes the MODFs and then decompresses each MODF into part of the FIT curve and causes display of the real-time FIT annular while drilling curve in its time-domain log or in a cross-plot of pressure-vs-time. The computing device can also provide a FIT analysis.

The present disclosure first discusses detection of pump-off pressure data corresponding to a formation integrity test (e.g., pump-off pressure data having a formation integrity test characteristic) and compression of the pump-off pressure data having a formation integrity test characteristic. The present disclosure then discusses transmission protocols for transmitting the compressed pump-off pressure data uphole.

Compression Protocol

A compression protocol is now described for transmitting pressure data in real-time (or near real-time) representing the FIT annular pressure while drilling pressure curve utilizing mud-pulse telemetry. As described below, the compression protocol can comprise: 1) detection of the FIT section; 2) filtering and decimation of the pressure data; 3) quantization of the pressure data; and 4) differential coding of the pressure data.

Detection of FIT Section

The FIT section can be defined from the start of pressure build-up in FIT to $P_{max}$ in the pumps-off pressure profile. The start of pressure build-up for a FIT is defined as a turning point where a substantial pressure change occurs. For example, the turning point can be assumed between the minimum pressure before $P_{max}$ (denoted as $P_{max}$) and $P_{max}$, as shown in FIG. 3.

To accelerate the detection process, in an example embodiment, the pressure points can be downsampled at 20-second sampling periods. To avoid the impact from measurement noise, a moving averaging can be taken during downsampling (e.g., the average value of respective pressure data in each 20-second window is assigned to the center point in that window).

Figure 3:
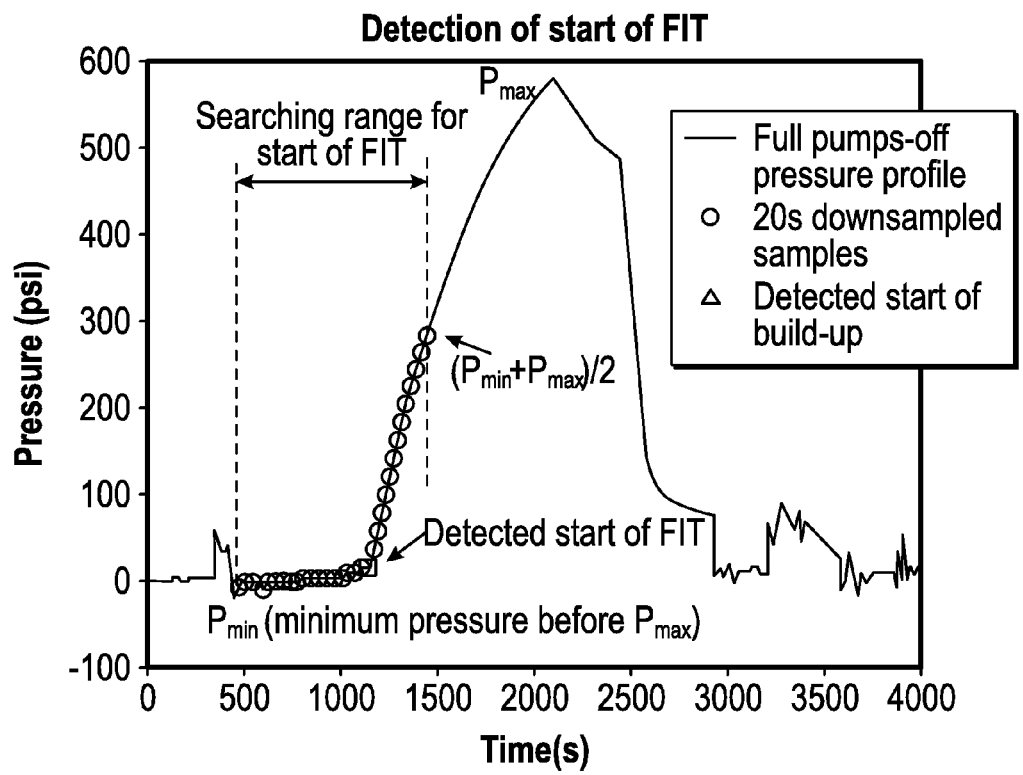
FIG. 3 illustrates a graph where the start of a formation integrity test is detected in accordance with an example embodiment of the present disclosure.

The searching range is set from $P_{min}$ to a middle pressure point at $(P_{min}+P_{max})/2$, as shown as the red circles in FIG. 3. In cases where multiple middle points are available, the last middle point is selected as the end of searching range.

Then, let $P_d(i)$, $i=0,1,\ldots,N_d$ denote the $N_d$ pressure points after downsampling. An initial threshold of pressure may be set as $P_{th}=5$ psi by the compression protocol and may be defined at the start of the FIT curve as:
1. Compute the pressure difference $\Delta P_d(i)=P_d(i+1)-P_d(i)$, $i=0,1,\ldots,N_d-2$.
2. Find the latest index i* where $\Delta P_d(i^*)<P_{th}$.
3. If $\Delta P_d(i)\geq P_{th}$, set i*=0 as the start of FIT and stop.
4. Else if $\Delta P_d(i)<P_{th}$ (i.e., i*=$N_d-2$), reduce the pressure threshold by half (i.e., $P_{th}=P_{th}/2$) and go to Step 2.
5. Else, set i* as the start of FIT and stop.

Figure 4:
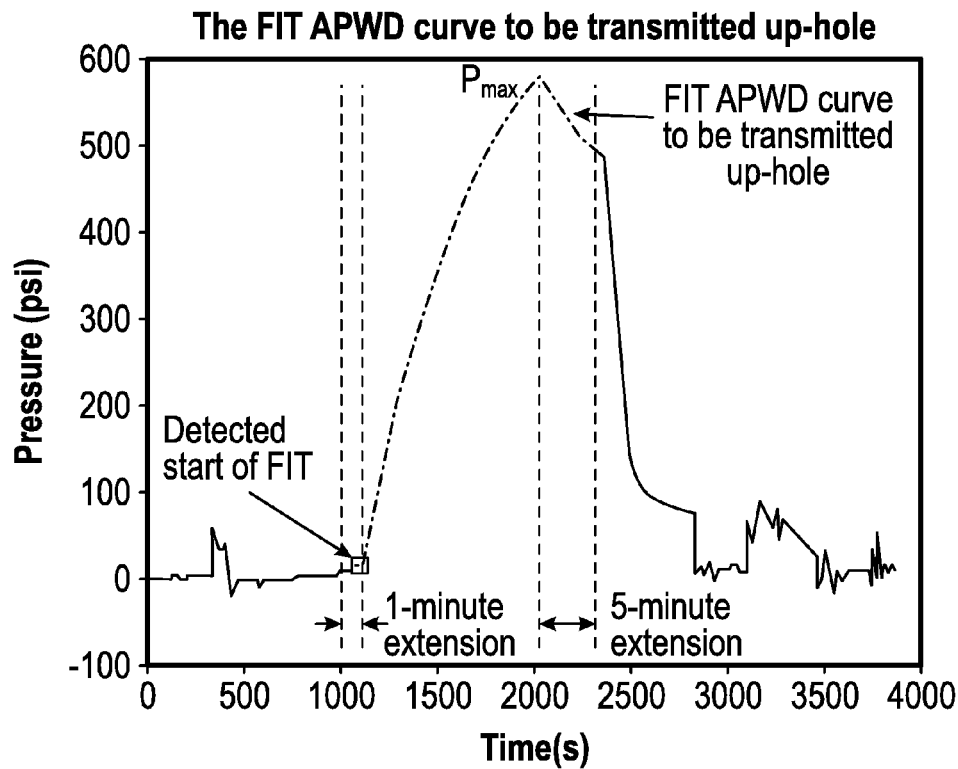
FIG. 4 is a graph, where a portion of the pressure curve corresponding to the formation integrity test annulus pressure while drilling is selected to be transmitted uphole in accordance with an example embodiment of the present disclosure.

The compression protocol allows extension data to be included on both sides of the FIT section in order to include more data according to the job requirements. FIG. 4 shows an example of FIT annular pressure while drilling curve with 1-minute extension before the start of FIT and a 5-minute extension after $P_{max}$.

Filtering and Decimation

The annular pressure while drilling data may contain measurement noise that can lower the compression efficiency. Moreover, the high sampling rate of original data might not be required for FIT analysis. Thus, in one or more embodiments, the pressure data having the FIT characteristics is filtered and decimated as described herein.

Figure 5:
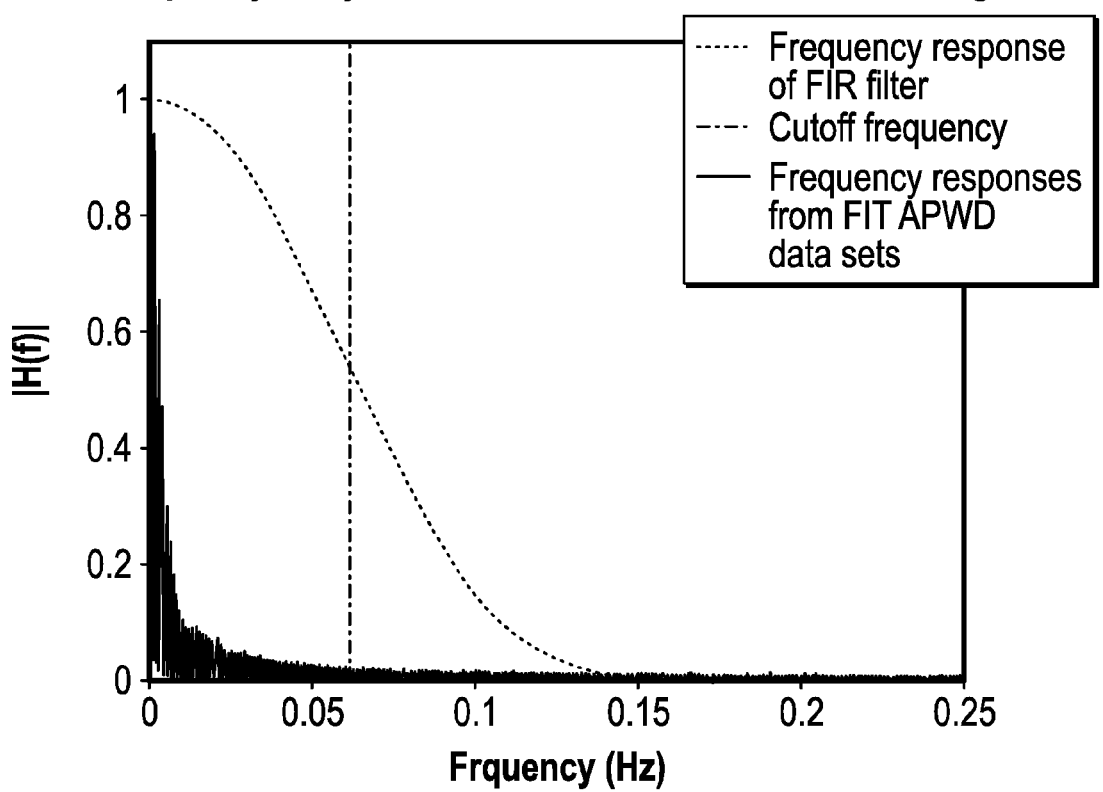
FIG. 5 is a frequency analysis of formation integrity test data in accordance with an example embodiment of the present disclosure.

The frequency analysis directed to the FIT annular pressure while drilling data sets is shown in FIG. 5. A 10th order low-pass FIR filter may be applied to the pressure data at the cut-off frequency of $\frac{1}{16}$ Hz and with the following coefficients:
{−0.003871323167475, 0, 0.032087799410030, 0.116708621643743, 0.220701186106900, 0.268747432013603, 0.220701186106900, 0.116708621643743, 0.032087799410030, 0, −0.003871323167475}.

The low-pass filter can also serve as an anti-aliasing filter for downsampling purposes.

Quantization

The filtered pressure data can be quantized as discussed herein. For example, let $P_f(i)$, $i=0,1,\ldots,N_f$ denote the $N_f$ pressure points after filtering and decimation. The quantization values can be calculated as $q(i)=\text{round}(P_f(i)/P_{resolution})$, $i=0,1,\ldots,N_f$, where $P_{resolution}$ is the pre-defined quantization stepsize or resolution. In an example embodiment, $P_{resolution}$ is set as 1 psi in order to favor an accurate FIT analysis and the quantization error is +/−0.5 psi.

During decompression, the de-quantization is performed on the decoded quantization values, $P_r(i)=q(i)\cdot P_{resolution}$, $i=0,1,\ldots,N_f$, where $P_r(i)$, $i=0,1,\ldots,N_f$ denote the reconstructed pressure values.

Differential Coding and Adaptive Entropy Code Design

Figure 6A:
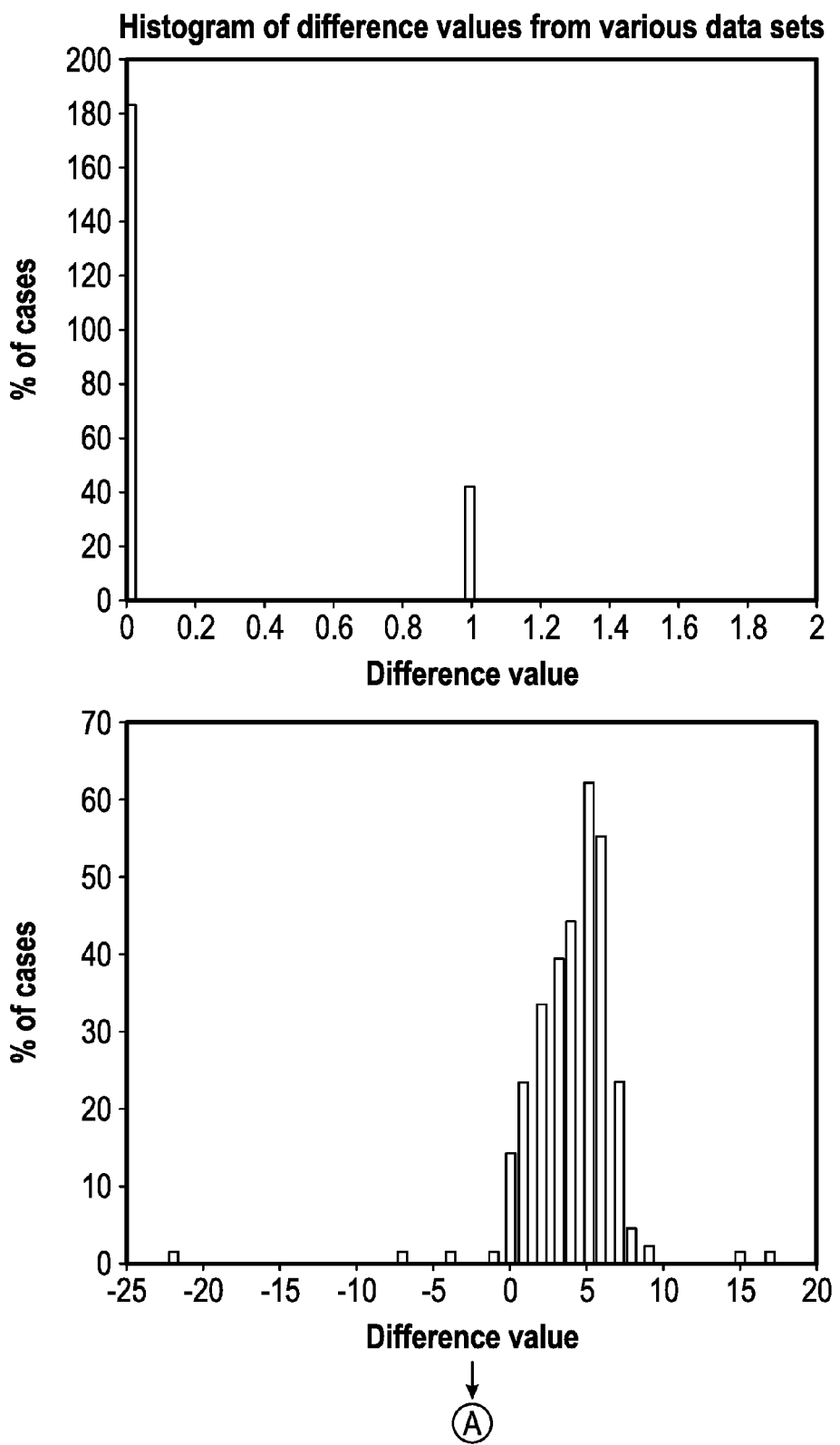
FIGS. 6A and 6B illustrate various histograms of difference values corresponding to a formation integrity test data in accordance with an example embodiment of the present disclosure.
Figure 6B:
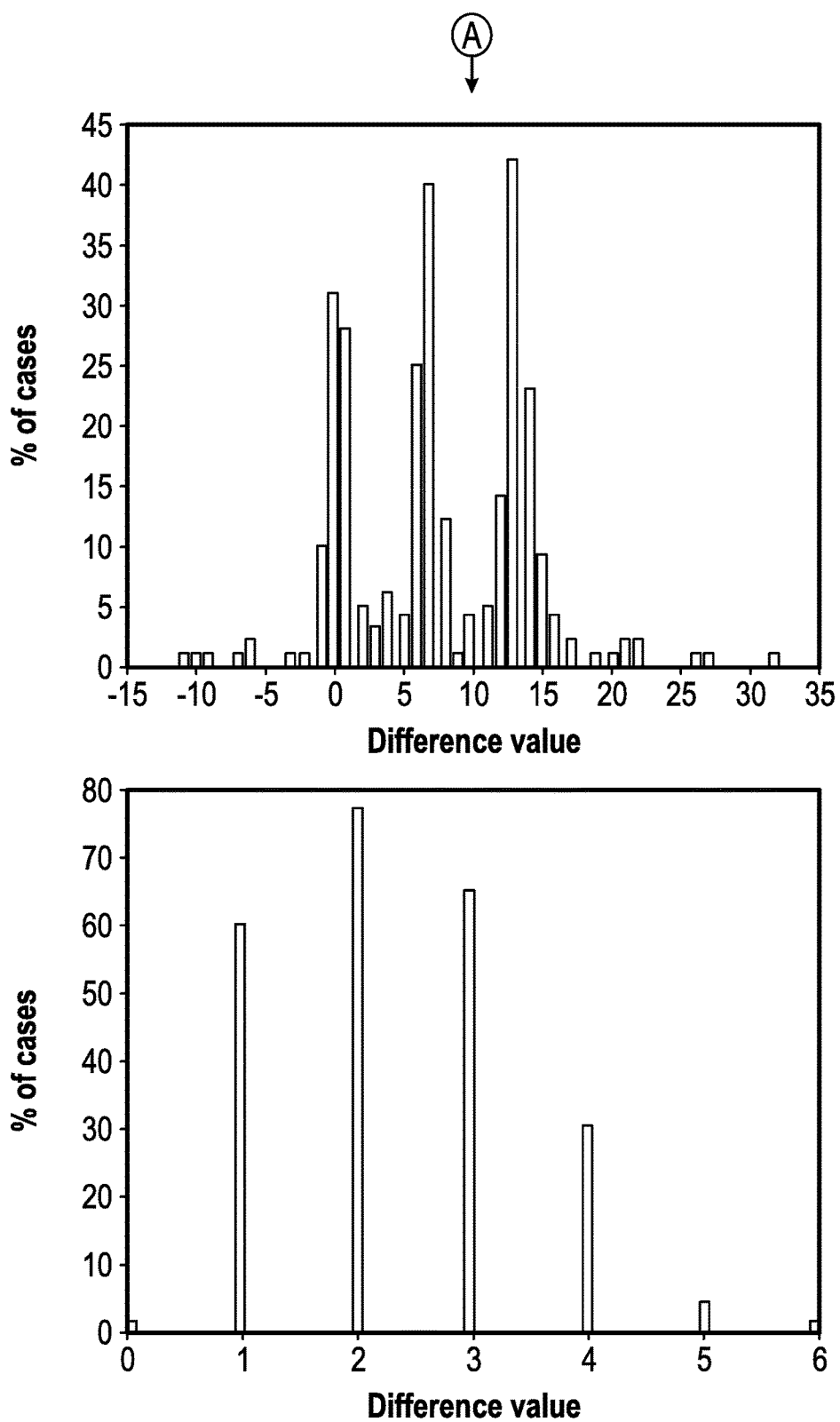
Figure 7A:
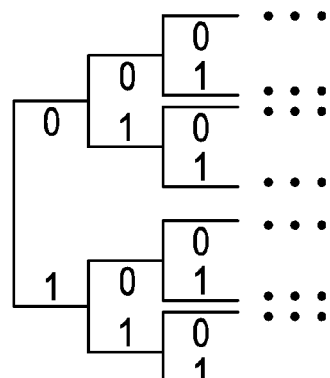
FIGS. 7A and 7B illustrates various Huffman code design models corresponding to formation integrity test data in accordance with an example embodiment of the present disclosure.
Figure 7A:
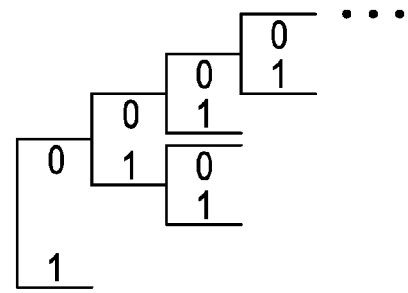
Figure 7A:
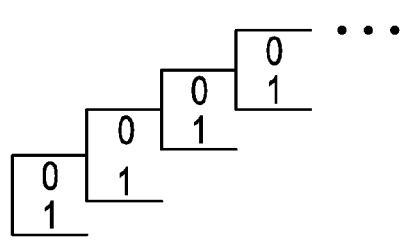
Figure 7A:
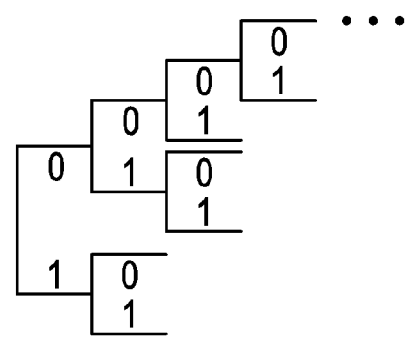
Figure 7A:
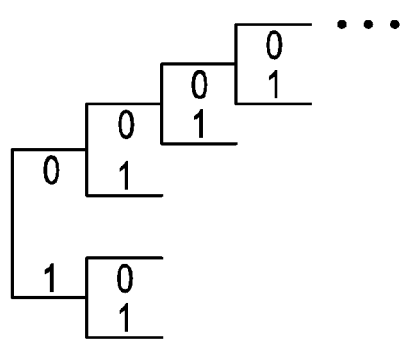
Figure 7A:
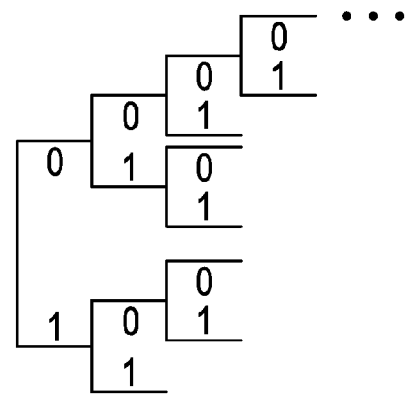
Figure 7B:
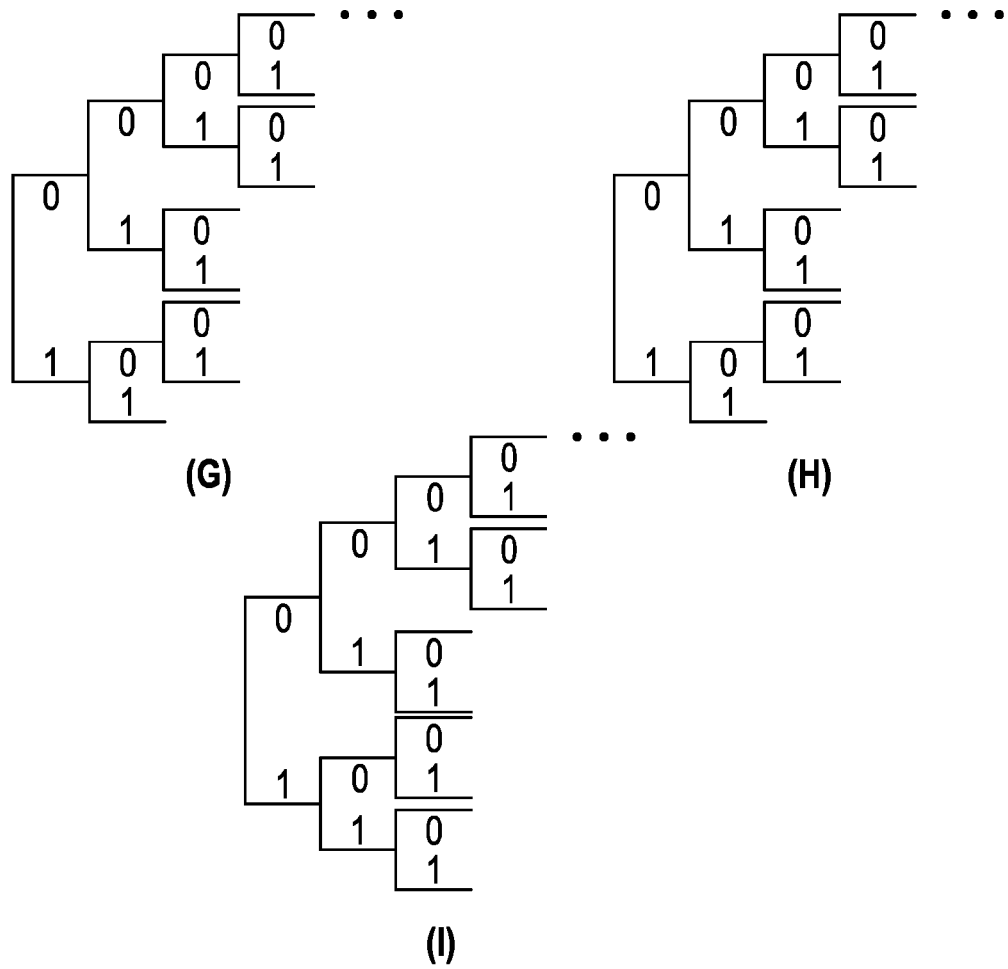

As shown in FIGS. 6A and 6B, different statistics histograms can be observed from various data sets. Each type of histogram may utilize a specific entropy coding for compression performance.

As such, an adaptive entropy code design that is adaptable to various data statistics is described. The adaptive entropy code design can be applied to the quantized pressure data. The adaptive entropy code design evaluates the histogram of difference values and generates a set of entropy codebooks from suitable Huffman code models. In an embodiment, there may be nine (9) Huffman code models utilized. The codebook using the least bits is selected to encode the data. The index of the optimal codebook in the set and the parameters to generate the codebook set are encoded and transmitted. During decompression, the codebook set is re-generated given the received parameters and the index is used to retrieve the codebook for decoding the difference values.

Figure 8:
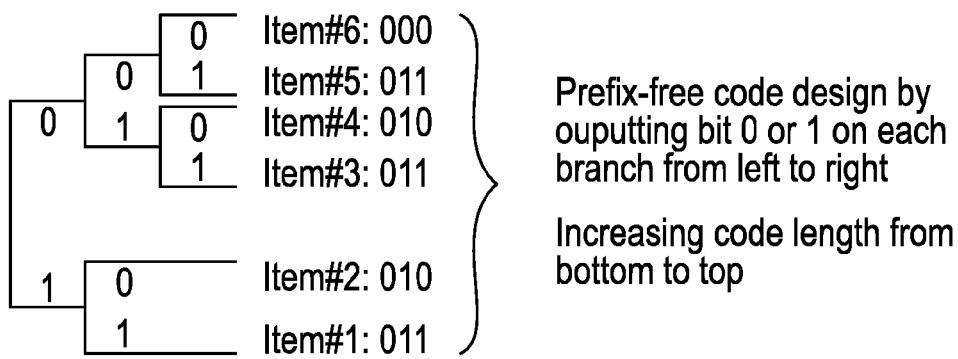
FIG. 8 illustrates an example of coding six (6) items using Huffman model (a) shown in FIG. 7A in accordance with an example embodiment of the present disclosure.

FIG. 7 illustrates the nine (9) Huffman code models used to design the entropy codebook set. An example of coding six (6) items based on Huffman model (a) is shown in FIG. 8. The Huffman model first expands the model with binary splitting and generates enough branches for available items. Then, the coding bits for each item are constructed by outputting bit 0 or 1 on respective branches from left to right. Note that the binary splitting is performed downward and thus an increasing code length is expected from bottom to top.

Histogram Evaluation

The statistics histogram of difference values can be different from case to case. In one or more embodiments, an efficient entropy code design utilizes the structure of statistics histogram of quantized differential values. The statistics histograms vary from case to case. For simplicity purposes, three parameters are used in the present disclosure:

$D_0$: The difference value of the highest occurrence. In case that multiple values have the same highest occurrence, the lowest one is selected as $D_0$.

$D_{max}$ and $D_{min}$: The maximum and minimum difference value, respectively.

Figure 9:
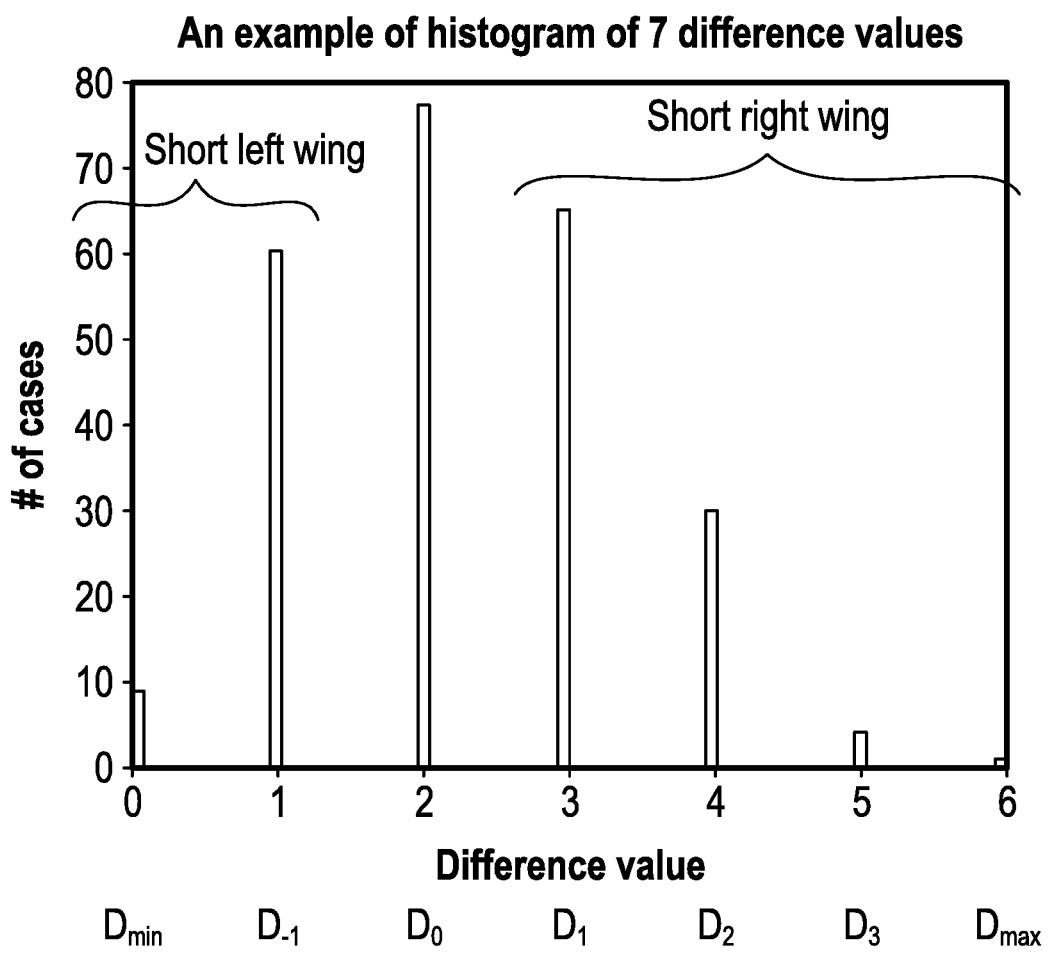
FIG. 9 illustrates an example histogram of seven (7) difference values in accordance with an example embodiment of the present disclosure.

An example of histogram is shown in FIG. 9, where $D_1$, $D_2, \ldots, D_{max}$ denote the difference values higher than $D_0$ and $D_{-1}, D_{-2}, \ldots, D_{min}$ denote the difference values lower than $D_0$.

These three parameters are encoded and transmitted to describe the basic structure of a histogram. Let $D^*_{max}$ and $D^*_{min}$ denote the maximum value of $D_{max}$ and the minimum value of $D_{min}$, respectively. In this work, they are set as $D^*_{max}=512$ and $D^*_{min}=-512$. Then, $D_{max}$ is encoded by applying the Huffman code model (a) on possible values of $0, 1, -1, 2, -2, 3, -3, \ldots, D^*_{max}, D^*_{min}$;

$D_{min}$ is encoded by applying the Huffman code model (a) on possible values of $D_{max}, D_{max}-1, \ldots, D^*_{min}$;

$D_0$ is encoded by applying the Huffman code model (a) on possible values of $D_{min}, D_{min}+1, \ldots, D_{max}$.

Codebook Set Design

The next step is to design entropy codebooks for respective difference values from $D_{min}$ to $D_{max}$. A lower number of occurrences is assumed for a value farther away from $D_0$. The difference values are sorted in a decreasing order of occurrence based on their distance to $D_0$. Then, an entropy codebook is designed by assigning less bits to values nearer to $D_0$ and more bits for ones farther from $D_0$. A set of entropy codebooks are available from various sorting results and Huffman code models.

Sorting of Difference Values

In an embodiment, the sorting of difference values is performed as follows:
1. Starting from $D_0$, output a certain number of difference values as the 1$^{st}$ group.
2. Output the remaining values on both sides of $D_0$ alternatively.
3. To accelerate the ordering, the number of values to output on each side of $D_0$ is doubled after each output.

Definitions:

Wings: a wing is defined as values on the left or right side of $D_0$, i.e., the left wing contains $D_{-1}, D_{-2}, \ldots, D_{min}$ and the right wing contains $D_1, D_2, \ldots, D_{max}$. A long wing is on the right if $D_{max}-D_0 \geq D_0-D_{min}$ and on the left if $D_{max}-D_0 < D_0-D_{min}$.

$N_{1stGroup}$: the number of the 1$^{st}$ group of difference values (starting from $D_0$) to output for sorting.

$N_{LongWingInThisStep}$ and $N_{ShortWingInThisStep}$: the number of difference values to output in one step on the long and short wing, respectively.

Sorting Process:

In an example embodiment, the sorting process may comprise:

1. Output the 1$^{st}$ group of $N_{1stGroup}$ values by starting from $D_0$ on the long wing. If the size of long wing is lower than $N_{1stGroup}$, (i.e., $D_{max}$ or $D_{min}$ is reached before $N_{1stGroup}$ values are output) continue to output the remaining values on the short wing in the direction away from $D_0$.

2. Output $N_{LongWingInThisStep}$ or $N_{ShortWingInThisStep}$ values by starting from next value to the last output one in this wing in the direction away from $D_0$. If $D_{max}$ or $D_{min}$ is reached before the specific number of values are output, move to the opposite wing and output the remaining values in the direction away from $D_0$.

3. Multiply $N_{LongWingInThisStep}$ or $N_{ShortWingInThisStep}$ by 2 (i.e., double the number of values to output on this wing in the next step).

4. Move to the opposite wing if $D_{max}$ or $D_{min}$ has not been reached on that wing. Otherwise, stay on the same wing as the last output value.

5. Repeat the steps from 2 by swinging between two wings until the difference values are output for sorting.

In an embodiment, an example with $N_{1stGroup}=2$, $N_{LongWingInThisStep}=2$ and $N_{ShortWingInThisStep}=1$ is given based on the histogram in FIG. 9:

1. Output $N_{1stGroup}=2$ values of $D_0$ and $D_1$ on the long (right) wing.
2. Output $N_{LongWingInThisStep}=2$ values of $D_2$ and $D_3$ on the long (right) wing
3. Update $N_{LongWingInThisStep}=4$;
4. Move to the short (left) wing and output $N_{ShortWingInThisStep}=1$ value of $D_{-1}$.
5. Update $N_{ShortWingInThisStep}=2$;
6. Move to the long (right) wing and suppose to output $N_{LongWingInThisStep}=4$ values in this step. However, one value may within that wing. After outputting $D_{max}$, move to the short (left) wing and continue to output $D_{min}$.
7. Stop since values have been output for sorting.

The final order of difference values is: $\{D_0, D_1\}$, $\{D_2, D_3\}$, $\{D_{-1}\}$, $\{D_{max}, D_{min}\}$, where $\{ \ldots \}$ denote the values output in the same step.

For respective Huffman code models, one codebook can be designed for the sorted difference values. In an example embodiment, the difference values are assumed to be sorted in the order of decreasing occurrence, so more bits are assigned to values which are output later, and the values which are output in the same step share the same "header" bits from the Huffman code model. Then Huffman code model (a) is used to code the "index" for each value if two or more values are in that group.

Figure 10:
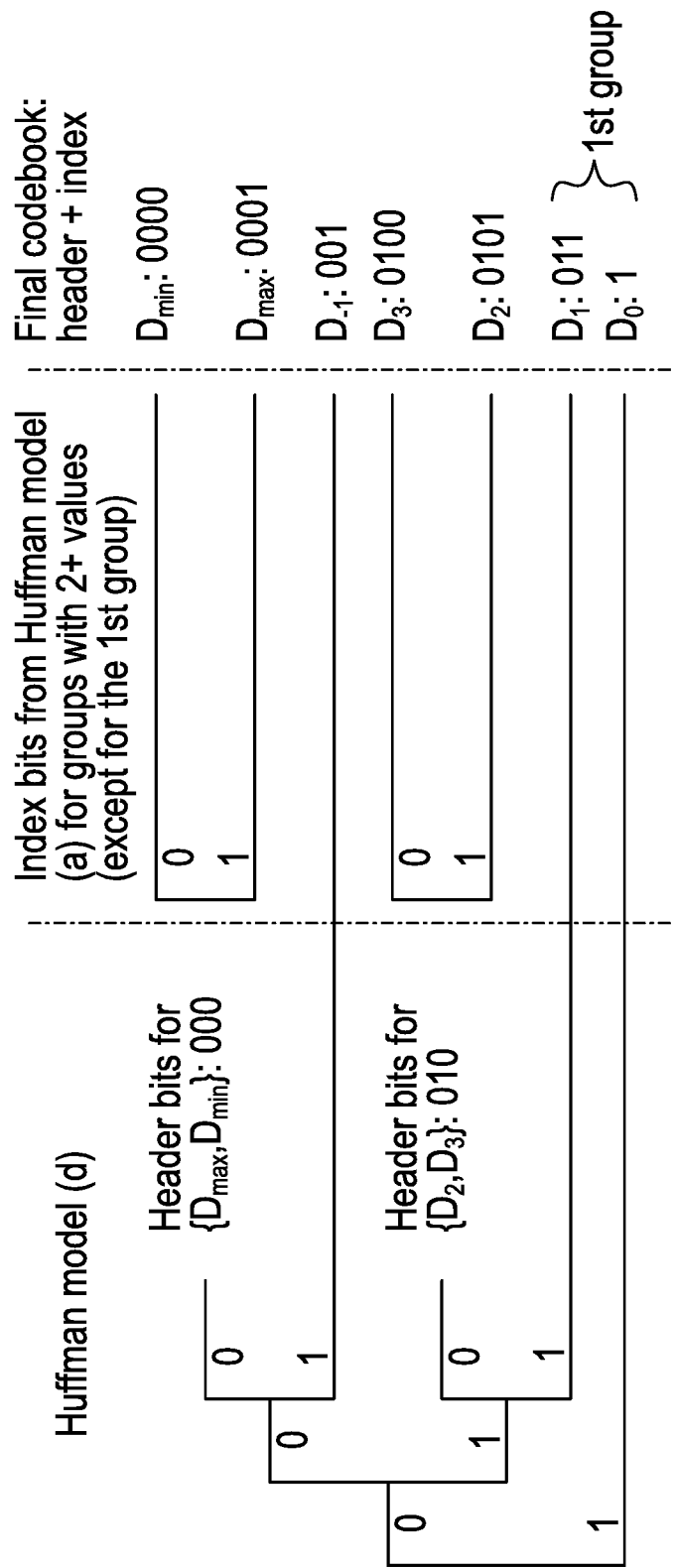
FIG. 10 illustrates an example code design for difference values shown in FIG. 9 using Huffman model (d) shown in FIG. 7A in accordance with an example embodiment of the present disclosure.

The code design for the above example based on Huffman code model (d) is illustrated in FIG. 10.

Given $D_0$, $D_{min}$, and $D_{max}$, a set of codebooks are available with various Huffman code models and parameters of ($N_{1stGroup}$, $N_{LongWingInThisStep}$, $N_{ShortWingInThisStep}$). In an example, the maximum numbers are set as 6, 2 and 1, respectively, and the codebook set is designed as follows:

Initialization: empty the codebook sets CodebookSet.
For $N_{1stGroup}$=1:6
　For $N_{LongWingInThisStep}$=1:2
　　For $N_{ShortWingInThisStep}$=1:1
　　　Sort the difference values as described above
　　　For each one of 9 Huffman code models (in FIG. 7)
　　　　Design a codebook for values as described above
　　　　If this new codebook is NOT in CodebookSet (i.e., the code length for each value is different from previous codebooks), add this new codebook to CodebookSet.

Optimal Codebook Selection

In the codebook set (e.g., CodebookSet), the optimal entropy codebook is selected as the entropy codebook that encodes the most difference values within the available bandwidth. In practice, a binary searching protocol can be applied to code as many values as possible.

Let $q(i)$, $i=0,1, \ldots, N_q-1$ denote $N_q$ quantization values and $N_b$ denote the available number of bits. Then, he binary searching protocol can comprise:

1. Encode the reference quantization value $q(0)$ using $N_{ref}$ bits. In an embodiment, $N_{ref}$ can be set to 15 bits to cover a pressure range of 0 psi to 30,000 psi with a quantization stepsize of $P_{resolution}=1$ psi.
2. Compute the difference values $\Delta q(i)=q(i+1)-q(i)$, $i=0,1, \ldots, N_q-2$.
3. Set $i_0=0$, $i_2=N_q-2$.
4. Evaluate the histogram of $\Delta q(i)$, $i=0,1, \ldots, i_1$ and compute $D_0$, $D_{min}$ and $D_{max}$.
5. Encode $D_{max}$, $D_{min}$ and $D_0$ and generate $N_{hist}$ coding bits in total.
6. Design the entropy codebook set.
7. For each codebook in the set, evaluate the number of bits to code respective values $\Delta q(i)$, $i=0,1, \ldots, i_1$ including the bits to index this codebook in the set (the index is encoded based on Huffman code model (a) as illustrated in FIG. 8).
8. From the results in Step 7, determine the optimal codebook Codebook that generates the minimum number of bits $N^*_{diff}$.
9. If $(N_{ref}+N_{hist}+N^*_{diff})>N_b$,
　a. If $i_1>i_0+1$, update $i_2=i_1$, $i_1=\text{floor}((i_0+i_2)/2)$ and go to Step 4.
　b. Else, set $i^*=i_0$ as the index of last difference value to be coded.
10. Else,
　a. If $i_1<i_2-1$, update $i_0=i_1$, $i_1=\text{floor}((i_0+i_2)/2)$ and go to Step 4.
　b. Else, set $i^*=i_1$ as the index of last difference value to be coded.

Output the compression bits for $q(i)$, $i=0,1, \ldots, i^*$

Compression Bit Layout

The compression bitstream corresponding to the pressure data (e.g., the pressure data corresponding to the FIT section) can be constructed by concatenating coding bits as output (as described above). In some instances, different statistics histogram are expected before and after $P_{max}$, two independent entropy coding schemes can be applied when $P_{max}$ is included within the available bandwidth. In this case, the pressure points before and at $P_{max}$ are first compressed into the minimum number of bits. Then, the remaining bits are used to code respective difference values after $P_{max}$. As illustrated in FIGS. 11A-11D, the position of $P_{max}$ is utilized to separate the two bitstreams. In this work, 8 bits are used to index up-to 256 points away from the reference pressure (i.e., a value 0 indicates $P_{max}$ is the 1$^{st}$ one after the reference point). For the portion after $P_{max}$, the coding of the reference pressure may not be included.

Real-Time Transmission

Once compressed, the compression bits are encapsulated into a sequence of MODFs for real-time transmission. In an embodiment, the MODFs can employ error protection to reduce bit errors from noisy mud-pulse telemetry. For example, the MODFs can employ a product single-parity check (PSPC) code error protection in accordance with an embodiment of the present disclosure.

Respective MODFs can be decompressed independently to reconstruct respective portions of the pressure curve. In the event that MODFs are missing or corrupted, the remaining MODFs can be used to reconstruct part of pressure curve, which may be sufficient for a FIT analysis.

The extension data after $P_{max}$ is configurable in order to include additional information after the FIT section. In an embodiment, if extension data has been utilized and there is still space in the MODF, additional extension data after $P_{max}$ can included until the remaining bits are used up.

MODF Definition

Figure 12:
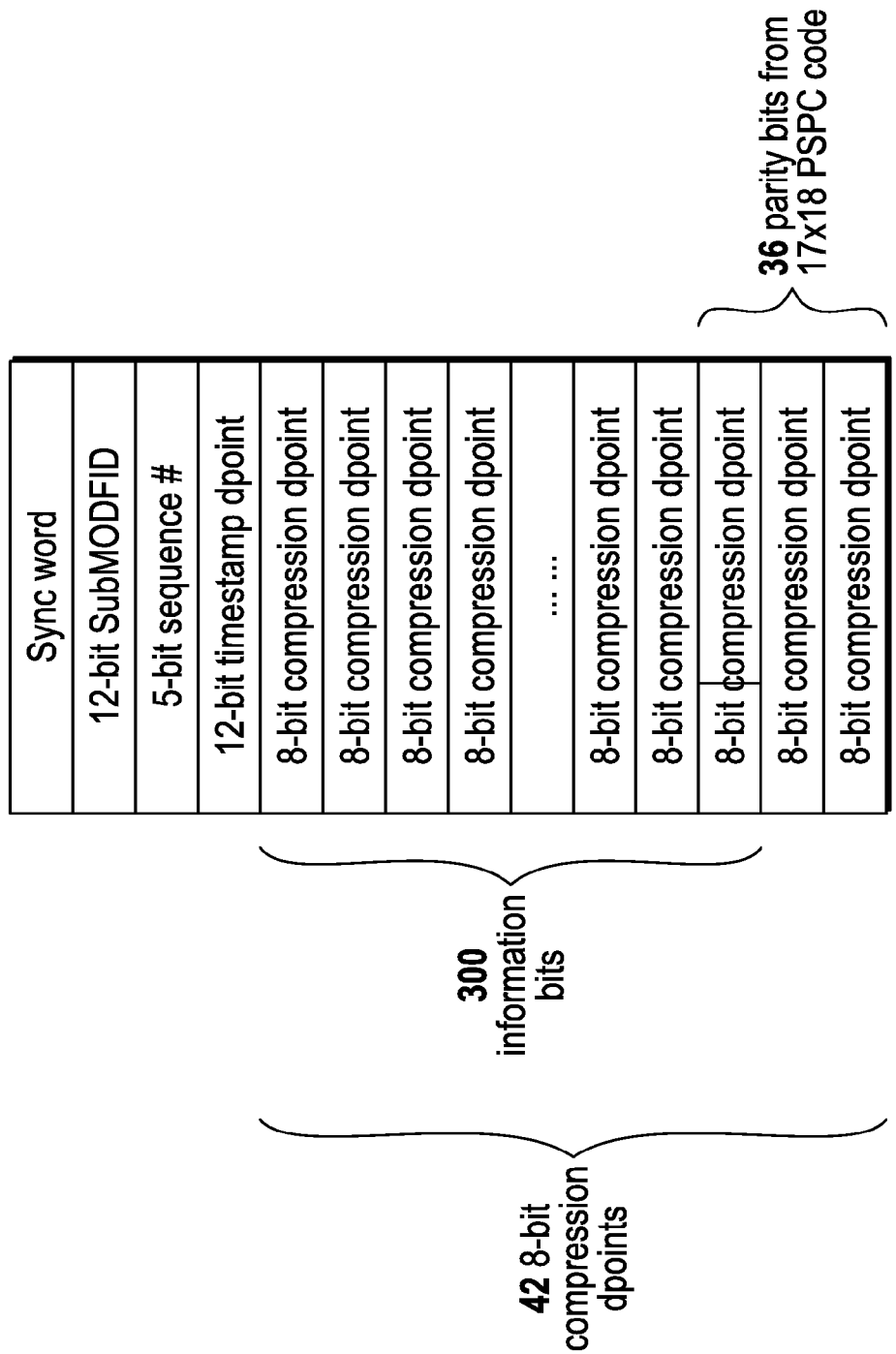
FIG. 12 illustrates an example block diagram of a multiple on-demand frame utilized for transmitting compressed pump-off pressure data corresponding to a formation integrity test in accordance with an example embodiment of the present disclosure.

A single MODF definition can be utilized in accordance with the present disclosure, as shown in FIG. 12. For instance, the MODF can constructed with a frame synchronization word (24 bits for QPSK modulation), a 12-bit SubMODFID dpoint (4 bits are used to identify up-to 16 MODF definitions shared by the tools in the bottom hole assembly and the remaining 8 bits are parity bits for error protection), a 5-bit sequence number dpoint, a 12-bit timestamp dpoint, and 42 8-bit compression dpoints. The 42 compression dpoints can contain 300 information bits and 36 parity bits from a 17×18 PSPC error correcting code. These 300 information bits represent the available bandwidth in each MODF and are used to code the pressure points as described above.

The 5-bit sequence number dpoint is used to identify up-to 31 MODFs in a sequence. Its full-scaled value 31 is to indicate an LTB error during tool communication. This dpoint can be used to monitor the MODF sequence in field and help calculate the remaining time to compete the sequence. It also provides the possibility to re-call a specific missing or corrupted MODF by downlinking with its sequence number. The 12-bit timestamp dpoint is used to compute the time span from the acquisition of reference pressure to the time when MWD requests this dpoint.

Transmission of Multiple On-Demand Frame

Figure 13:
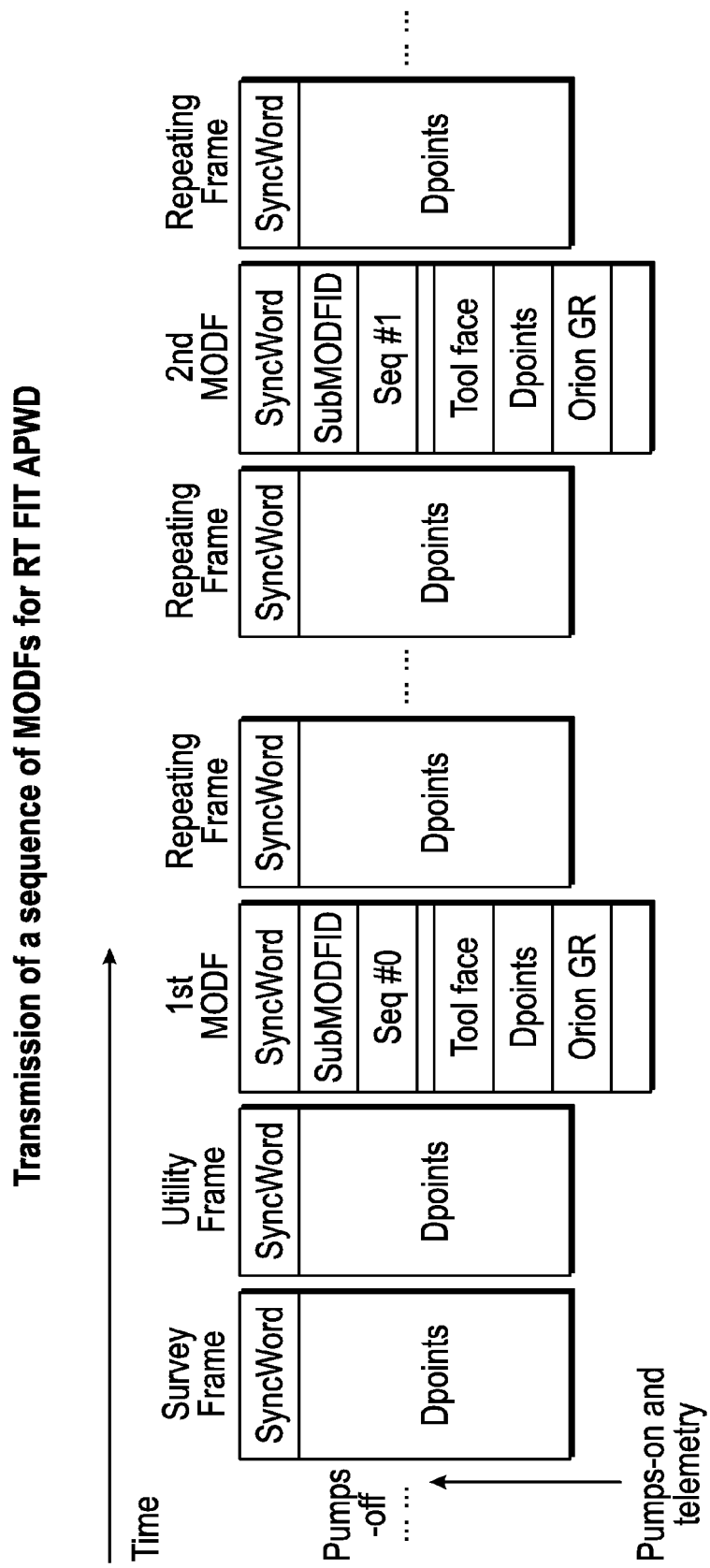
FIG. 13 is a block diagram illustrating an example transmission of a sequence of multiple on-demand frames in accordance with an example embodiment of the present disclosure.

The MODF sequence is transmitted following the survey and utility frames after the telemetry resumes, as illustrated in FIG. 13.

The transmission of the first MODF can be delayed if compression cannot be finished in time or MWD fails to obtain the MODF correctly upon the completion of utility frame. In an embodiment, repeating MODF frames are transmitted instead to avoid telemetry interference. Additionally, dpoints from other measurements (e.g., tool face) can be embedded in MODF to meet possible requirements on update rates. To avoid the gaps in real-time logs during the MODF transmission, the MODFs and repeating frames can be transmitted in an interleaving manner and mud pulse system dpoints (single-curve compression) in repeating frames can be used to fill up-to 200-second gaps.

The time interval between MODFs is programmable in order to adapt with various telemetry speeds. The time interval may be set to zero so that the whole MODF sequence is transmitted before any repeating frame and the latency of real-time FIT annular pressure while drilling pressure curve is minimized.

Experimental Results

During simulation, 1-minute and 5-minute extensions are assumed before the start of FIT and after $P_{max}$, respectively. However it is understood that the extension after $P_{max}$ can be longer than 5 minutes in order to fill (e.g., complete) the last MODF.

Figure 14:
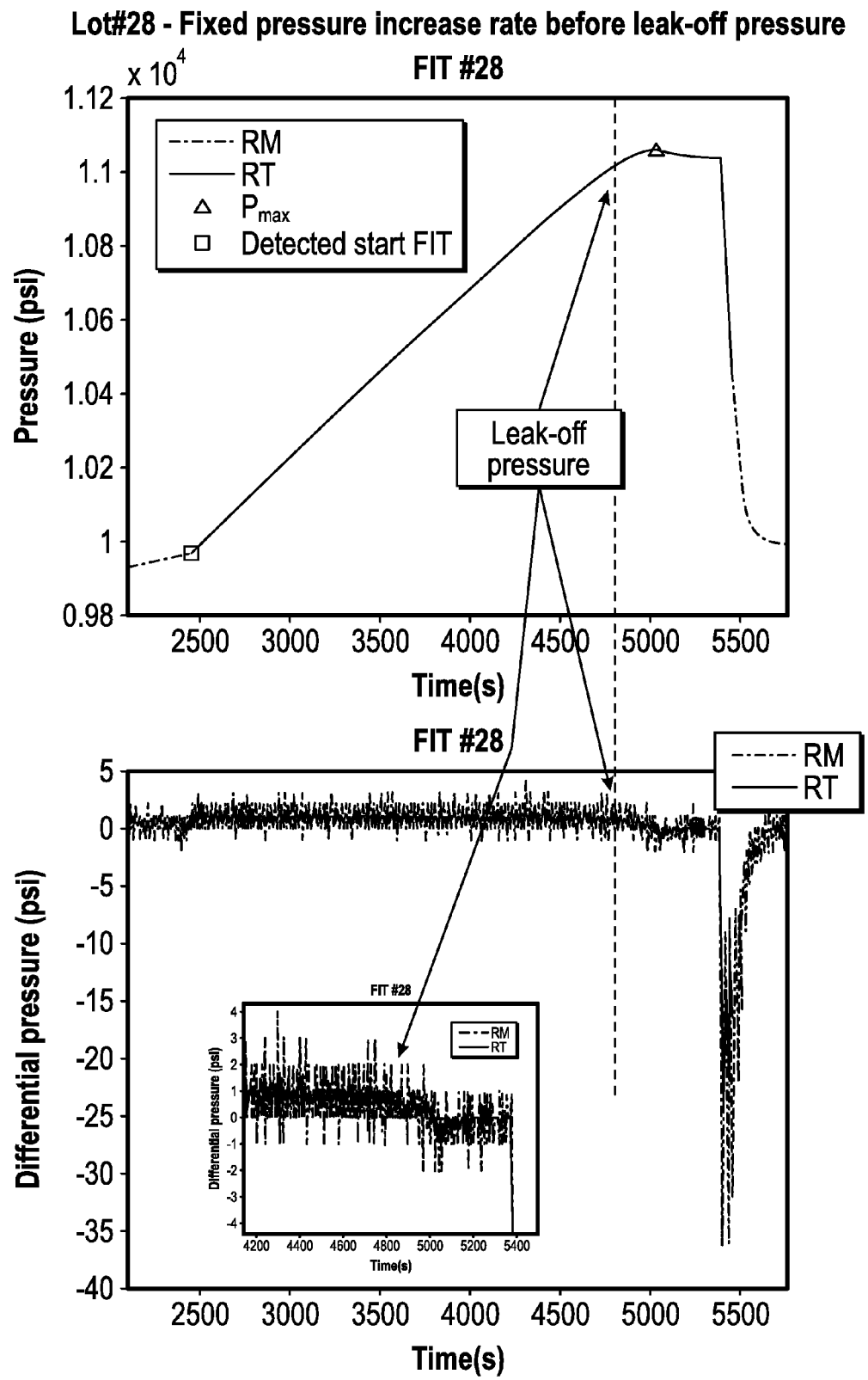
FIG. 14 illustrates a graph showing a fixed pressure increase rate before leak-off pressure in accordance with an example embodiment of the present disclosure.

FIG. 14 illustrates a FIT annulus pressure while drilling curve, where the annulus pressure is increased at an almost fixed rate until it reaches the leak-off pressure. The blue curve is the recorded-mode (RM) data from a tool dump file and the red curve represents the real-time curve. From the differential pressure curve as shown at the bottom of FIG. 14, the change at around 4,800 seconds indicates the presence of the leak-off pressure. In this embodiment, the total time length of real-time FIT annulus pressure while drilling pressure curve data is 51 minutes. This pressure cure utilizes five (5) MODFs, and transmission uphole takes 5.4 minutes at a 6 bits/second telemetry speed.

Figure 15:
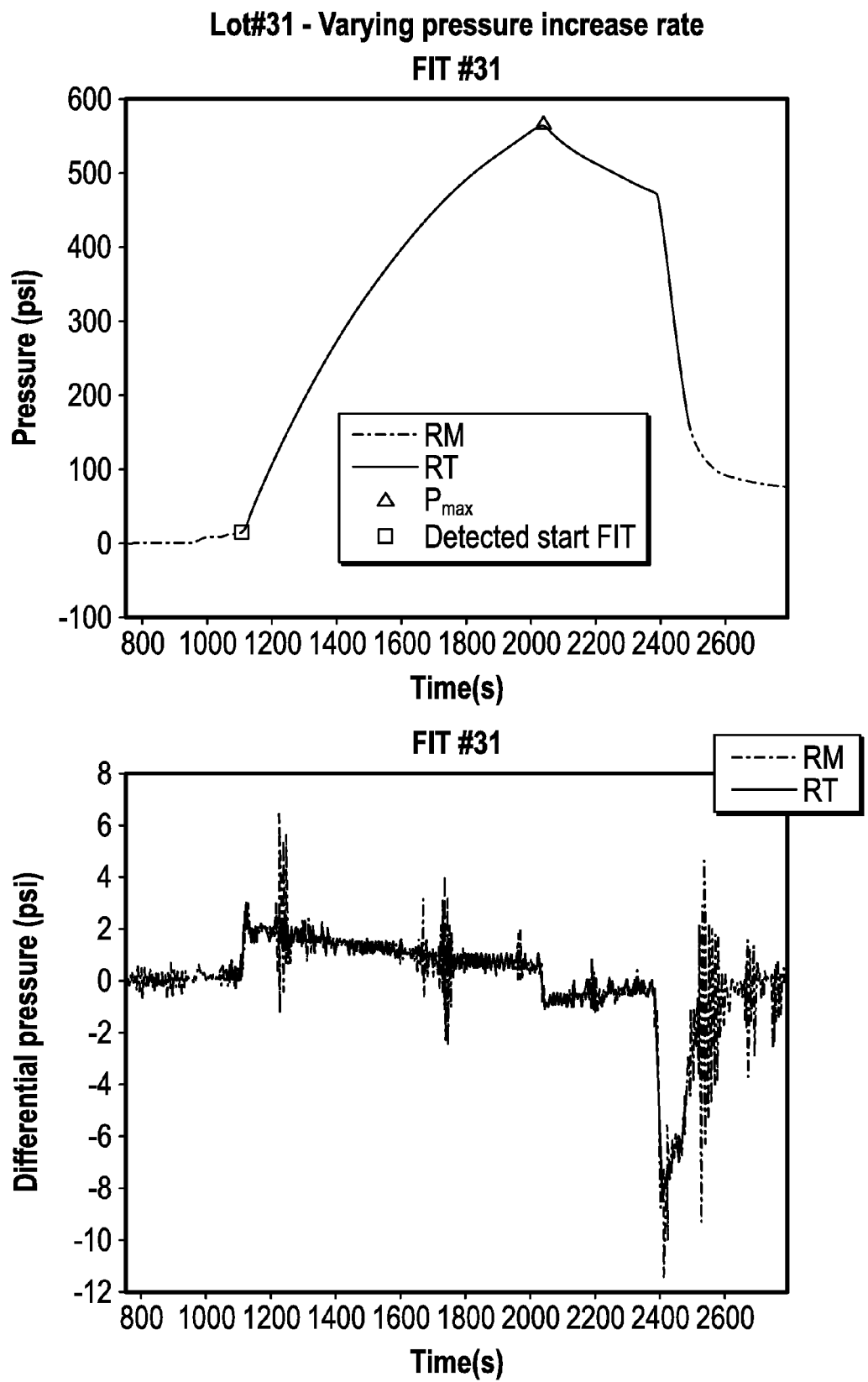
FIG. 15 illustrates a graph showing a varying pressure increase rate in accordance with an example embodiment of the present disclosure.

FIG. 15 illustrates a case of a varying pressure increasing rate during FIT. As shown, the pressure changes are captured in the differential pressure curve. In this embodiment, the 23.9-minute FIT annulus pressure while drilling data is transmitted utilizing three (3) MODFs in a time of 3.2 minutes at a 6 bits/second telemetry speed.

Figure 16:
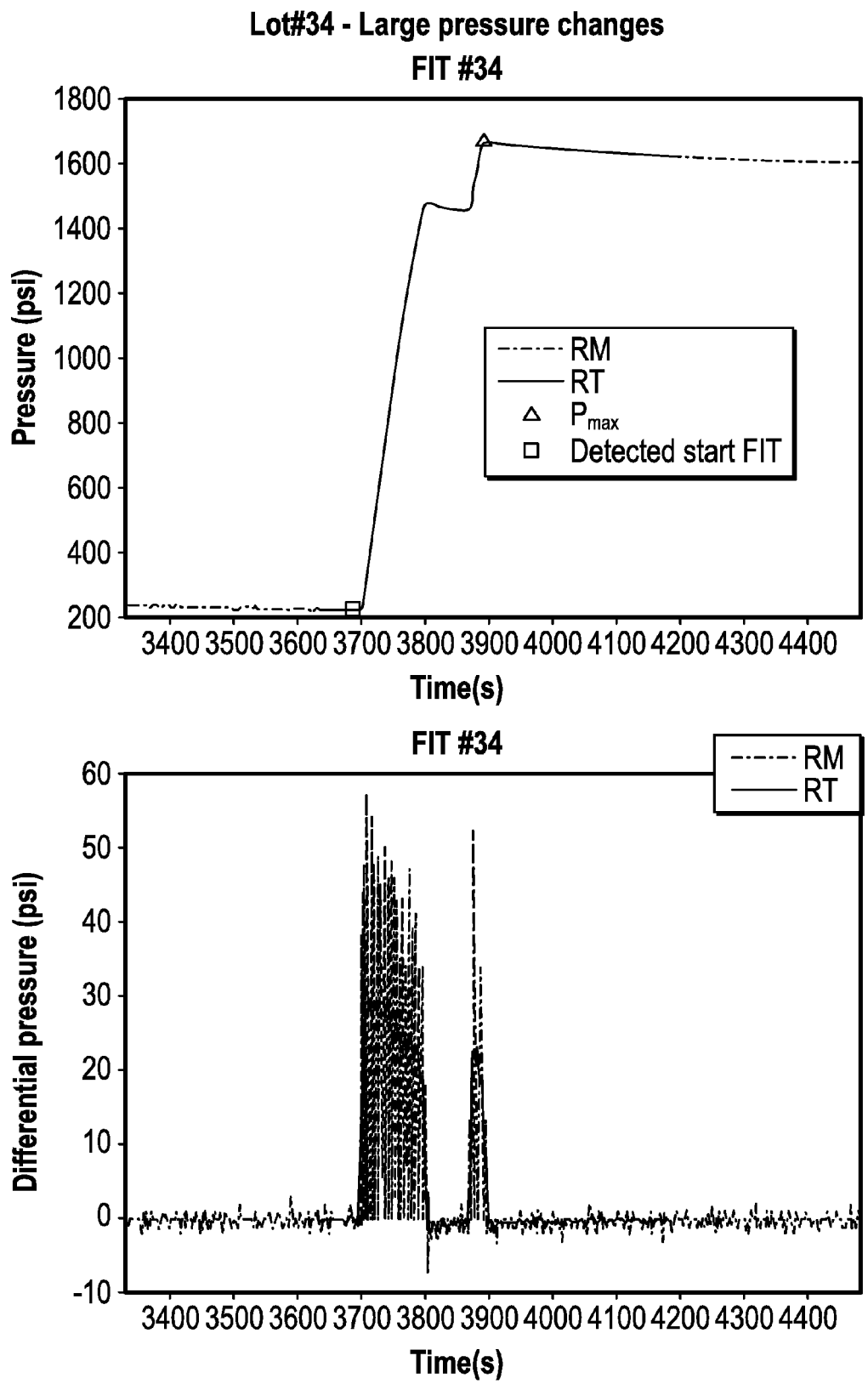
FIG. 16 illustrates a graph showing various pressure changes in accordance with an example embodiment of the present disclosure.

A case of large pressure difference (up-to 30 psi after filtering) is shown in FIG. 16. As shown, two (2) MODFs are used to send the 9.4-minute FIT annulus pressure while drilling pressure curve at a transmission time or 2.2 minutes at a 6 bits/second telemetry speed.

Figure 17:
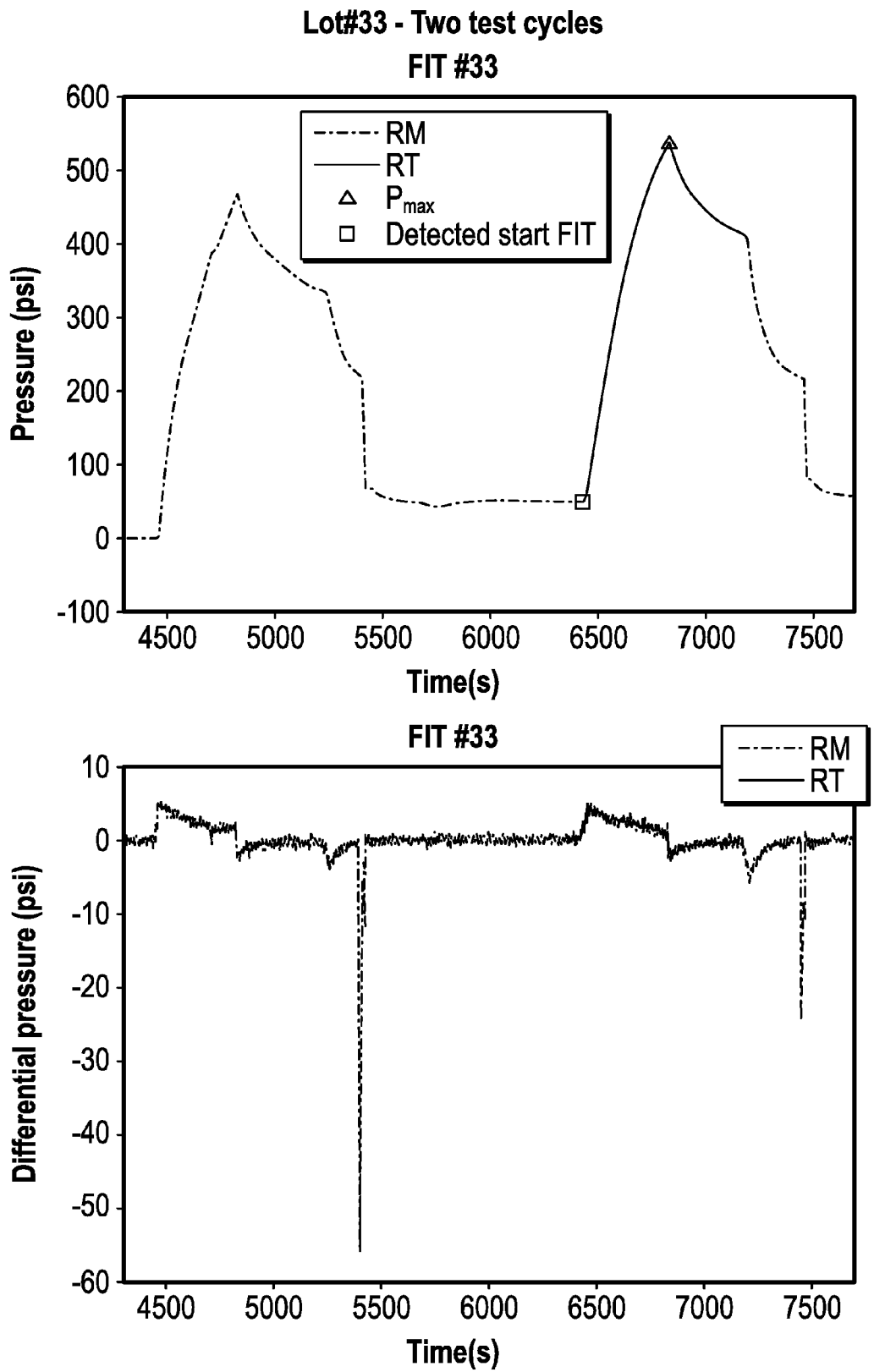
FIG. 17 illustrates two graphs, each graph showing a respective test cycle in accordance with an example embodiment of the present disclosure.

FIG. 17 shows an example of two FIT cycles. The FIT part with the highest $P_{max}$ is selected for RT transmission. It uses 2 MODFs and takes 2.2 minutes to send the 13.3-minute FIT annulus pressure while drilling pressure profile curve at a 6 bits/second telemetry speed.

Although only a few example embodiments have been described in detail above, those skilled in the art will readily appreciate that many modifications are possible in the example embodiments without materially departing from the present disclosure. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A process for transmitting a pump-off pressure profile for formation integrity testing from a measurement while drilling tool to a surface location, the process comprising:

measuring pump-off pressure data in a wellbore, the pump-off pressure data representing the pump-off pressure profile;

determining a minimum pressure data point and a maximum pressure data point from the pump-off pressure data;

selecting data points having a value greater than the minimum pressure data point and less than the maximum pressure data point as a pump-off pressure data portion corresponding to a formation integrity testing characteristic;

compressing the pump-off pressure data portion with a compression protocol to produce a plurality of compression bits, the plurality of compression bits representing the pump-off pressure data portion corresponding to the formation integrity testing characteristic, the compressing including (i) quantizing the selected data points to obtain quantized data points, (ii) evaluating a histogram of the quantized data points to generate a set of codebooks from a plurality of Huffman code models, and (iii) encoding the quantized data points using the codebook that requires the least number of bits to produce the plurality of compression bits; and causing the measurement while drilling tool to generate a plurality of pressure pulses to transmit the plurality of compression bits to a computing device at the surface location.

2. The process of claim 1, wherein the compression bits are transmitted using a sequence of multiple on-demand frames.

3. The process of claim 1, wherein the selected data points are filtered using a low pass filter prior to quantizing in (i).

4. The process of claim 3, further comprising: applying a differential coding protocol to the quantized data points prior to evaluating a histogram of the quantized data points in (ii).

5. The process of claim 1, wherein the selected data points are filtered using a low pass filter to obtain filtered data points and the filtered data points are decimated to a preselected sampling period prior to quantizing in (i).

6. The process of claim 1, wherein evaluating a histogram of the quantized data points to generate a set of codebooks comprises evaluating a histogram of difference values between sequential ones of the quantized data points to generate a set of codebooks.

7. The process of claim 6, wherein evaluating the histogram of difference values comprises determining a difference value having the highest occurrence, a maximum difference value, and a minimum difference value.

8. The process of claim 7, wherein (ii) further comprises generating the set of codebooks for respective difference values from the minimum difference value to the maximum difference value.

9. The process of claim 8, wherein the codebooks are assigned less bits for difference values nearer to the difference value having the highest occurrence than for difference values further from the difference value having the highest occurrence.

10. The process of claim 8, wherein the codebook that encodes the most difference values within an available bandwidth is used to encode the quantized data points in (iii) and produce the plurality of compression bits.

* * * * *